(12) United States Patent
Lim

(10) Patent No.: US 7,888,610 B2
(45) Date of Patent: Feb. 15, 2011

(54) KEYPAD AND METHOD FOR IDENTIFYING KEYSTROKES OF A KEYPAD

(75) Inventor: Teck Chye Allen Lim, Singapore (SG)

(73) Assignee: Infineon Technologies AG, Neubiberg (DE)

(*) Notice: Subject to any disclaimer, the term of this patent is extended or adjusted under 35 U.S.C. 154(b) by 240 days.

(21) Appl. No.: 12/212,670

(22) Filed: Sep. 18, 2008

(65) Prior Publication Data

US 2010/0066571 A1    Mar. 18, 2010

(51) Int. Cl.
*H01H 9/26* (2006.01)
(52) U.S. Cl. ..................................... 200/5 A
(58) Field of Classification Search .............. 200/5 A, 200/600, 512, 5 R; 341/26, 33, 20, 22; 345/158, 345/168, 173
See application file for complete search history.

(56) References Cited

U.S. PATENT DOCUMENTS 6,504,492 B1 * 1/2003 Muurinen .................... 341/22
6,992,601 B2   1/2006 Chiu et al.
7,256,768 B2 * 8/2007 Bathiche ..................... 345/168
7,609,178 B2 * 10/2009 Son et al. ..................... 341/33

FOREIGN PATENT DOCUMENTS

JP    06223677 A    8/1994

* cited by examiner

*Primary Examiner*—Edwin A. Leon
(74) *Attorney, Agent, or Firm*—Patterson Thuente Christensen Pedersen, P.A.

(57) ABSTRACT

Embodiments of the invention are related to a keypad and an electronic device having a keypad. In one embodiment a keypad comprises a plurality of keys. Each of the plurality of keys comprises one main electrode and at least one signal electrode is being adapted to connect electrically the main electrode and the at least one signal electrode when said key is pressed. The main electrode is connected to a reference potential connection of the keypad and surrounds the at least one signal electrode of said key.

21 Claims, 2 Drawing Sheets

KEYPAD AND METHOD FOR IDENTIFYING KEYSTROKES OF A KEYPAD

FIELD OF THE INVENTION

The invention relates to a keypad and a method for reading keystrokes of a keypad.

BACKGROUND

Keypads comprising a plurality of different keys usually use encoding methods in order to reduce the number of required electric connections. One common method to encode keys of a keypad is to use two-dimensional encoding combined with a scan process. For this purpose the keys are arranged in a matrix having columns assigned to respective electrical column lines and rows assigned to respective electrical row lines. Such a conventional keypad structure is illustrated in FIG. 1. Each key 2 is coupled to one column line C1-C5 and one row line R1-R5 such that when a key is pressed it connects electrically the column line C1-C5 and the row line R1-R5 at the intersection where the key is located. In order to determine what key has been pressed, or in other words to read the keystrokes, the column lines and the row lines have to be scanned. Scanning can be done, for example, by applying a specific voltage to the column lines one by one and by determining at which row line this voltage can be detected.

In order to apply a voltage to a connection line C1-C5, R1-R5 of the keypad or to read the voltage from such a line the respective line has to be connected to an electronic circuit which then is susceptible to electrostatic discharge.

Further multidimensional encoding of keys of a keypad is known. In multidimensional encoding schemes the keys are coupled to three lines which are connected electrically to each other when the key is pressed. Each of the lines coupled to a key belongs to one of in total three groups of lines. In order to read the keystrokes of this multidimensionally encoded keypad the lines of the three groups of lines have to be scanned accordingly.

SUMMARY OF THE INVENTION

A keypad with a plurality of keys is provided. Each of the plurality of keys comprises at least one signal electrode and a main electrode and is adapted to connect electrically the main electrode and the at least one signal electrode when said key is pressed. Furthermore, the main electrode of each of the plurality of keys is connected to a reference potential connection of the keypad and surrounds the at least one signal electrode of the respective key.

DETAILED DESCRIPTION

Figure 1:
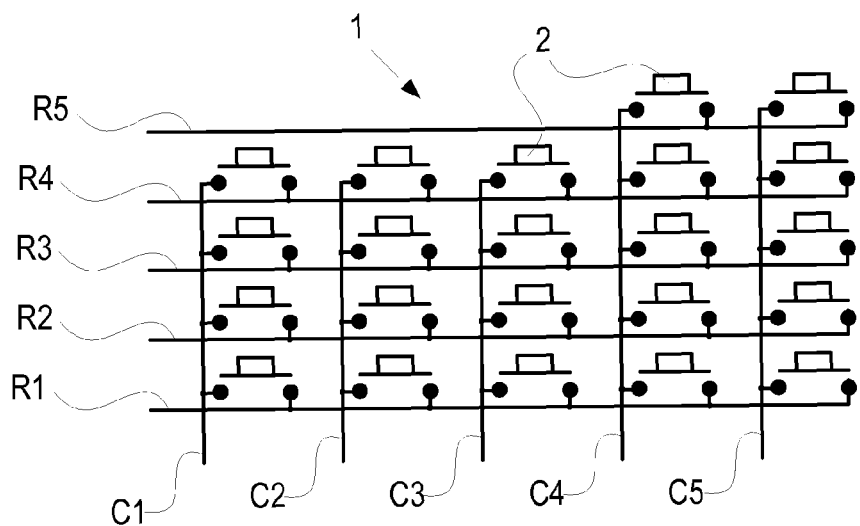
FIG. 1 is a schematic circuit diagram of a conventional keypad using two-dimensional encoding.
Figure 2:
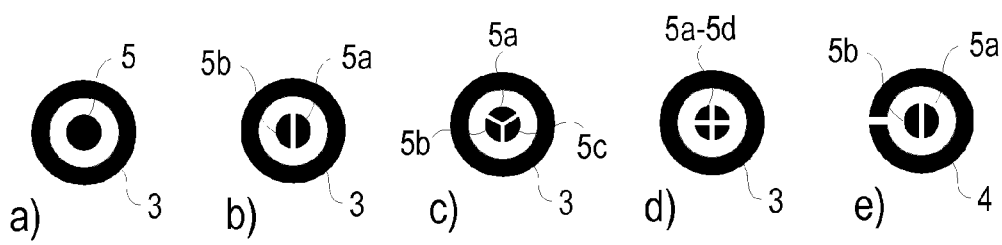
FIG. 2 is a top view of different electrode structures for use in keys of a keypad according to an embodiment.
Figure 3:
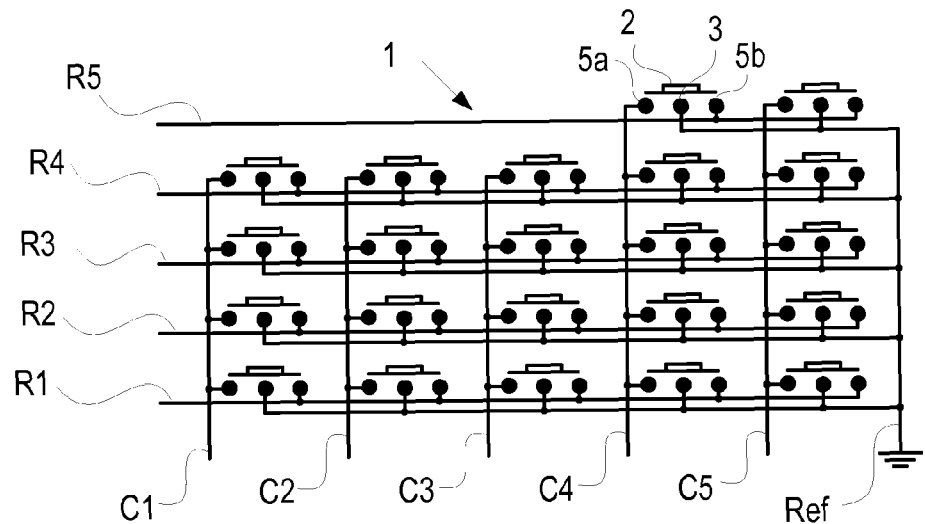
FIG. 3 is a schematic circuit diagram of a keypad according to an embodiment.

FIG. 3 shows a keypad 1 according to an embodiment. Keypad 1 comprises a plurality of keys 2 arranged according to a matrix. Each of the plurality of keys 2 comprises a main electrode 3 and two signal electrodes 5a and 5b. Each main electrode 3 at least partially laterally surrounds the two signal electrodes 5a and 5b of its key 2, as will be described below in more detail with reference to FIG. 2. Keypad 1 furthermore comprises a set of electrical column lines C1 to C5 and a set of electrical row lines R1 to R5. In an embodiment the row lines R to R5 extend substantially perpendicularly to the column lines C1 to C5.

Each of the plurality of keys 2 is adapted to selectively electrically couple the main electrode 3 and both signal electrodes 5a and 5b of the respective key 2. In one embodiment, selective coupling occurs when said key 2 is pressed. For this purpose each of the plurality of keys 2 in an embodiment comprises an electrically conductive movable contact element that couples the main electrode 3 and the signal electrode 5a and 5b of a key 2 when the key 2 is pressed. The movable contact element may be resilient and for example made of electrically conductive rubber.

The main electrodes 3 of each of the plurality of keys 2 are connected together and to a reference potential connection Ref of keypad 1. The reference potential connection Ref in an embodiment is ground level but may have any other fixed potential within keypad 1.

Each of the plurality of keys 2 comprises one column signal electrode 5a and one row signal electrode 5b. Each column signal electrode 5a is connected to one of the set of column lines C1 to C5 and each row signal electrode 5b is connected to one of the set of row lines R1 to R5. The column signal electrode 5a and the row signal electrode 5b of each of the plurality of keys 2 is assigned such that each of the plurality of keys 2 is assigned to a different combination of column line C1 to C5 and row line R1 to R5. In other words, there is only one key 2 assigned to the same column line C1 to C5 and the same row line R1 to R5. For example, the uppermost and rightmost key 2 in FIG. 3 is connected with its column signal electrode 5a to column line C5 and with its row line electrode 5b to row line R5. No other of the plurality of keys 2 is connected to the same combination of column line C5 and row line R5. Thus, by pressing the uppermost and rightmost key 2 in FIG. 3 the potentials of column line C5 and of row line R5 are pulled to the reference potential of the reference connection Ref.

Figure 5:
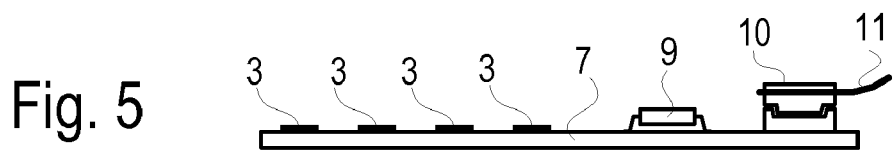
FIG. 5 is a side view of a keypad according to an embodiment.

In order to determine which key 2 has been pressed, the column lines C1 to C5 and the row lines R1 to R5 are connected to a keypad controller 9 which is depicted in FIG. 5. The keypad controller 9 is an electronic circuit adapted to sense the column lines C1 to C5 and the row lines R1 to R5 to determine which key 2 has been pressed. This can be achieved by sensing the electrical resistance from each column line C1 to C5 and each row line R1 to R5 to the reference potential connection Ref. The column lines C1 to C5 and the row lines R1 to R5 in an embodiment are directly electrically connected to the keypad controller 9.

In a further embodiment the column lines C1 to C5 and the row lines R1 to R5 can be sensed by measuring their respective potential, provided that the connection of a column line C1 to C5 or a row line R1 to R5 to the reference potential connection Ref by pressing a key 2 changes the electrical potential of the connected line. This behaviour can be achieved for example by connecting each column line C1 to C5 and each row line R1 to R5 through a resistive element or a current source to a potential different from the reference potential Ref. In an embodiment the resistive element or the current source are integrated in the keypad controller 9.

Keypad controller 9 has stored the pattern of which column line C1 to C5 and which row line R1 to R5 is assigned to each of the plurality of keys 2 in an internal memory.

In a further embodiment keypad 1 is adapted to determine whether more than one key 2 has been pressed and to generate a signal indicating that more than one key 2 has been pressed. In a further embodiment keypad 1 is adapted to generate a signal indicating which keys 2 have been pressed if more than one key 2 has been pressed.

Figure 4:
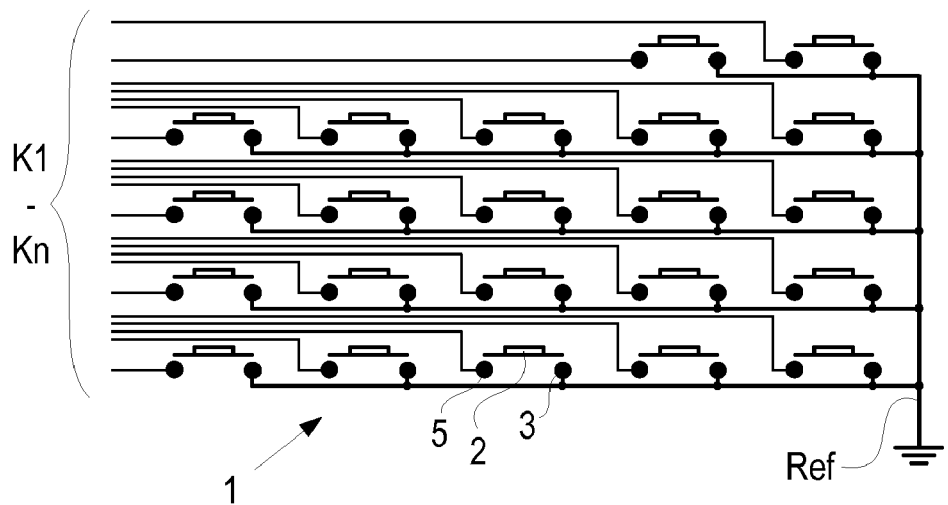
FIG. 4 is a schematic circuit diagram of a keypad according to a further embodiment.

FIG. 4 shows a keypad 1 according to a further embodiment. Keys 2 have only two electrodes, i.e. one main electrode 3 and one signal electrode 5. Main electrode 3 is connected to the reference potential connection Ref and at least partially laterally surrounds the signal electrode 5. The signal electrode 5 of each key 2 is connected to a respective key line K1 to Kn, wherein n is the number of keys 2 of keypad 1. In this embodiment there is one key line K1 to Kn for each key 2. In order to determine which key 2 is pressed, the key lines K1 to Kn are sensed. This can be done, for example, by measuring the resistance between each of the plurality of key lines K1 to Kn and the reference potential connection Ref or by measuring the potential of every key line K1 to Kn if the potential of the key lines K1 to Kn changes by pressing the respective key. As in the case of the embodiment of FIG. 3, this can be achieved, for example, by connecting each key line K1 to Kn via a resistance or a current source to a potential different from the reference potential Ref.

The key lines K1 to Kn may be connected directly to the keypad controller 9 or may be connected to an encoder which is not shown. An encoder should have as many inputs as key lines K1 to Kn are present, i.e. n. The encoder may have fewer output lines for outputting an encoded signal for indicating which key 2 has been pressed.

FIG. 2 shows various embodiments a) to e) of main electrode 3 and of signal electrodes 5 and 5a to 5e. The first embodiment a) includes an annular main electrode 3 laterally surrounding a single signal electrode 5. Embodiment a) may be used in a keypad according to the embodiment shown in FIG. 4 in which only one signal electrode 5 is required per key 2. Embodiment b) shows one annular main electrode 3 laterally surrounding two signal electrodes 5a and 5b and may be used in a keypad according to FIG. 3. Signal electrodes 5a and 5b have a semicircular shape and are arranged such that together they have a circular shape.

Embodiments c) and d) show one annular main electrode 3 laterally surrounding three signal electrodes 5a to 5c or four signal electrodes 5a to 5d respectively. Embodiments with more than two signal electrodes can be used for multidimensional encoding using three or more sets of lines, instead of two sets of lines like row lines and column lines. In embodiments a) to d) with main electrodes 3 forming closed rings which laterally surround signal electrodes 5 and 5a to 5d, the enclosed signal electrodes 5, 5a to 5d may be connected via a through-contact in a substrate carrying the main electrode 3 and the signal electrodes 5, 5a to 5d.

Embodiment e) shows an annular main electrode 4 having a gap. Main electrode 4 includes a gap such that it does not form a closed ring but rather partially laterally surrounds two signal electrodes 5a and 5b. Even with the gap, the main electrode 4 can protect the inner signal electrodes 5a and 5b by conducting ESD-pulses to the reference potential connection Ref and thus keeping them away from the signal electrodes 5a and 5b. In one embodiment the signal electrodes 5a and 5b partially laterally surrounded by main electrode 4 may be connected via lines extending through the gap.

In the embodiments depicted in FIG. 2, main electrodes 3 and 4 are generally annular, or ring-shaped. In other embodiments, main electrode 3 can comprise some other shape or configuration, such as a square or oval, that also at least partially laterally surrounds signal electrodes 5 and 5a to 5d. Signal electrodes 5 and 5a to 5d can also have other shapes and configurations in other embodiments.

FIG. 5 shows a substrate 7 comprising an electrically insulating material. In one embodiment, substrate 7 is a printed circuit board. On one surface, substrate 7 comprises a patterned electrical conductive layer which forms main electrodes 3 and within each main electrode 3 two signal electrodes which are not depicted. The main electrodes 3 and the signal electrodes are connected to a keypad controller 9. Furthermore, a connector 10 is mounted on the substrate 7 and connects the keypad controller 9 to a flexible cable 11. The keypad 1 in an embodiment is adapted to send signals indicating which key has been pressed and to receive electric power through the flexible cable 11.

Figure 6:
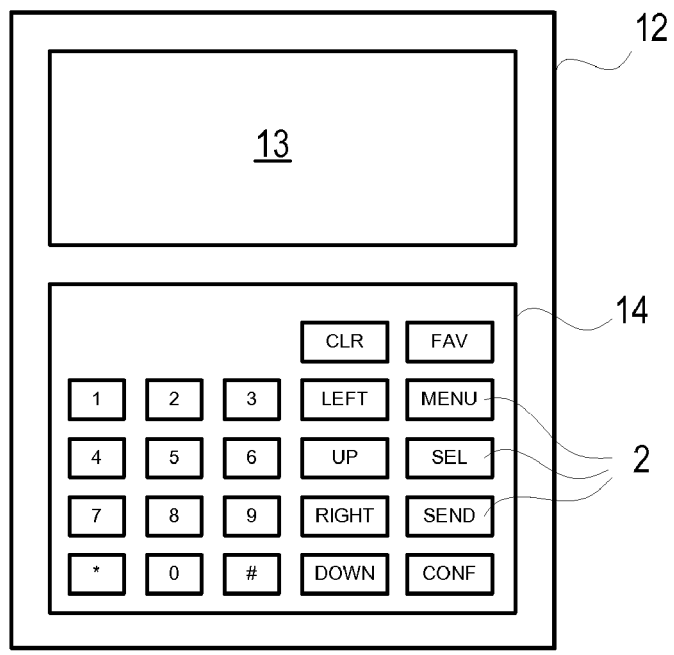
FIG. 6 is a top view of an electronic device according to an embodiment.

FIG. 6 shows one embodiment of an electronic device 12 having a keypad. Device 12 is a mobile phone having a display and a keypad section 14 comprising a keypad and keys 2. Various embodiments depicted and described herein above can be implemented as part of device 12.

The invention claimed is:

1. A keypad comprising:
    a plurality of column signal lines;
    a plurality of row signal lines;
    a reference potential connection; and
    a plurality of keys, each of the plurality of keys comprising at least one signal electrode, wherein a first of the at least one signal electrode is coupled to one of the plurality of column signal lines and a second of the at least one signal electrode is coupled to one of the plurality of row signal lines such that each of the plurality of keys is coupled to a unique combination of a column signal line and a row signal line, a main electrode coupled to the reference potential and at least partially laterally surrounding the at least one signal electrode, and a contact element adapted to selectively electrically couple the main electrode and the at least one signal electrode.

2. The keypad of claim 1, wherein the main electrode laterally surrounds the at least one signal electrode of the respective key.

3. The keypad of claim 2, wherein the main electrode laterally surrounds a single electrically conductive structure, and wherein the single electrically conductive structure comprises the at least one signal electrode.

4. The keypad of claim 1, wherein the reference potential connection is coupled to ground.

5. The keypad of claim 1, wherein the contact element is adapted to selectively electrically couple the main electrode and the at least one signal electrode when the key is pressed.

6. The keypad of claim 1, wherein the main electrode is annular.

7. The keypad of claim 6, wherein each of the plurality of keys comprises at least two signal electrodes, and wherein each of the at least two signal electrodes forms part of a circumference.

8. The keypad of claim 1, further comprising a substrate including a patterned electrically conductive layer, wherein the main electrodes and the at least one signal electrode comprise at least a portion of the electrically conductive layer.

9. The keypad of claim 1, wherein the main electrode and the at least one signal electrode extend in the same plane.

10. The keypad of claim 1, further comprising an electric circuit coupled to the at least one signal electrode of each of the plurality of keys and adapted to provide an output signal related to a selective electrical coupling of the main electrode and the at least one signal electrode of at least one of the plurality of keys.

11. The keypad of claim 1, further comprising an electric connector adapted to couple the keypad to a flexible cable.

12. An electronic device comprising:
a keypad, the keypad comprising a plurality of signal lines, a reference potential connection and a plurality of keys, each of the plurality of keys comprising:
at least one signal electrode, wherein the at least one signal electrode is coupled to one of the plurality of signal lines, a main electrode coupled to the reference potential connection and at least partially laterally surrounding the at least one signal electrode, and a contact element adapted to selectively electrically couple the main electrode and the at least one signal electrode.

13. The electronic device of claim 12, further comprising a keypad controller including a plurality of inputs, each of the plurality of inputs respectively coupled to one of the plurality of signal lines, the keypad controller adapted to scan the inputs to identify a selective electrical coupling of the main electrode and the at least one signal electrode of at least one of the plurality of keys.

14. The electronic device of claim 13, wherein the keypad controller comprises interrupt logic coupled to the plurality of inputs.

15. The electronic device of claim 12, wherein each of the at least one signal electrode is coupled to a potential by a current limiter, and wherein the potential is different from a reference potential.

16. The electronic device of claim 15, wherein the current limiter comprises a resistor.

17. A keypad comprising:
a reference potential connection; and
a plurality of keys, each of the plurality of keys comprising:
a column signal electrode, a row signal electrode, a main electrode coupled to the reference potential connection and configured to at least partially laterally surround the column signal electrode and the row signal electrode, and a contact element adapted to selectively electrically couple the main electrode, the row signal electrode and the column signal electrode.

18. The keypad of claim 17, further comprising:
a plurality of column signal lines; and
a plurality of row signal lines, wherein the column signal electrode of each of the plurality of keys is coupled to one of the plurality of column signal lines and the row signal electrode of each of the plurality of keys is coupled to one of the plurality of row signal lines such that each of the plurality of keys is coupled to a unique combination of a column signal line and a row signal line.

19. The keypad of claim 17, wherein each of the plurality of row lines and each of the plurality of column lines is coupled to an interrupt input of a keypad controller.

20. The keypad of claim 17, wherein the reference potential connection is coupled to ground.

21. The keypad of claim 17, wherein the plurality of row signal lines and the plurality of column signal lines is coupled to a current source.

* * * * *